United States Patent [19]

Takashima

[11] Patent Number: 5,319,526
[45] Date of Patent: Jun. 7, 1994

[54] MEANS FOR CONNECTING CPU BOARDS TO A RADIAL-AND-PARALLEL BUS STRUCTURE

[75] Inventor: Tokuhei Takashima, Tokyo, Japan
[73] Assignee: Graphico Co., Ltd., Tokyo, Japan
[21] Appl. No.: 8,850
[22] Filed: Jan. 25, 1993

Related U.S. Application Data

[63] Continuation of Ser. No. 774,836, Oct. 11, 1991, abandoned.

[30] Foreign Application Priority Data

Oct. 19, 1990 [JP] Japan .................... 2-282367

[51] Int. Cl.⁵ .................................... H05K 7/20
[52] U.S. Cl. .................... 361/788; 361/784; 361/785; 361/789; 361/790; 361/791; 439/65
[58] Field of Search ............. 439/55, 61, 65, 628–637; 361/692, 694, 696, 699, 775, 777, 778, 784, 785, 790, 796; 174/16.1; 165/80.3, 104.34, 122

[56] References Cited

U.S. PATENT DOCUMENTS

| | | | |
|---|---|---|---|
| 3,794,784 | 2/1974 | Snider | 200/11 A |
| 4,850,899 | 7/1989 | Maynard | 439/628 |
| 4,888,663 | 12/1989 | Longerich et al. | 174/175 F |
| 5,038,467 | 8/1991 | Murphy | 439/628 |
| 5,060,111 | 10/1991 | Takashima | 439/65 |

FOREIGN PATENT DOCUMENTS

158072  6/1990  Japan .................... 439/628

OTHER PUBLICATIONS

English translation of Japanese Pat. Appln. No. 1-102,909.

Primary Examiner—Gary F. Paumen

[57] ABSTRACT

Disclosed is a means for connecting CPU Boards to a radial-and-parallel system bus structure which is consisted of a stack of bus-printed disks whose centers are arranged on a common center axis. Each bus-printed disk comprises a disk of dielectric material bearing a printed radial pattern including a plurality of printed signal conductors radially extending from the center of the disk, and means to connect the end of each radial signal conductor to a selected lead in a selected one of said CPU boards standing upright around said stack of bus-printed disks. A connecting means according to the present invention comprises a plurality of receptacles fixed to the circumference of each disk. Each receptacle is connected at its rear end to the end of each radial signal conductor, and is adapted to detachably accept at its front a selected lead pin of each of said CPU boards. This arrangement facilitates the assembling and disassembling of a stack of disks.

7 Claims, 3 Drawing Sheets

MEANS FOR CONNECTING CPU BOARDS TO A RADIAL-AND-PARALLEL BUS STRUCTURE

This application is a continuation of application Ser. No. 07/774,836 filed on Oct. 11, 1991, now abandoned.

BACKGROUND OF THE INVENTION

1. Field of the Invention

The present invention relates to a radial-and-parallel system bus structure for use in a micro processor computer system, and more particularly to means for connecting CPU Boards to such a radial-and-parallel system bus structure.

2. Description of the Prior Art

The inventor proposed a radial-and-parallel system bus structure as a substitute for a conventional bus structure in U.S. Pat. No. 5,060,111 which issued on Oct. 22, 1991.

The radial-and-parallel system bus structure disclosed therein consists of a stack of bus-printed disks whose centers are arranged on a common center axis. Each bus-printed disk comprises a disk of dielectric material bearing a printed radial pattern including a plurality of printed signal conductors radially extending from the center of the disk, and means to connect the end of each radial signal conductor to a selected lead in a selected one of said CPU boards standing upright around said stack of bus-printed disks.

As may be described with reference to FIGS. 6 and 7, necessary electrical connections between CPU boards 23 and the printed signal conductors of disks 1 can be made as follows: first, longitudinal receptacle-and-pin assemblies 21 are attached to a stack of bus-printed disks 1 by inserting their L-shaped pins 22 in the through holes with which the printed signal conductors are terminated; and second, longitudinal lead pin assemblies 24 of CPU boards 23 are mated with the longitudinal receptacle-and-pin assemblies 21 by inserting the lead pins of longitudinal lead pin assemblies 24 of CPU boards 23 in the receptacles of the longitudinal receptacle-and-pin assemblies 21 of disks 1.

However, insertion of L-shaped pins 22 in the through holes of the disks 1 is very difficult partly because a relatively large number of disks are stacked leaving a relatively small space between adjacent disks 1. Still disadvantageously, when one-or more disks are found defective after having been assembled in an integrated stack form, it is difficult to remove such defective disk or disks and insert new ones in the stack, which has numerous longitudinal receptacle-and-pin assemblies 21 integrally connecting all disks 1.

SUMMARY OF THE INVENTION

One object of the present invention is to provide means for connecting CPU Boards to such a radial-and-parallel system bus structure and wherein said means permits the connecting of CPU Boards to signal conductors of bus-printed disks with ease and the disassembling of the stacked disk pile and the changing of selected disks with ease.

To attain this object means are provided for connecting CPU Boards to a radial-and-parallel system bus structure which consists of a stack of bus-printed disks whose centers are arranged on a common center axis, each bus-printed disk compresses a disk of dielectric material bearing a printed radial pattern including a plurality of printed signal conductors radially extending from the center of the disk; and means to connect the end of each radial signal conductor to a selected lead in a selected one of said CPU boards standing upright around said stack of bus-printed disks. The present invention improves such a device in that said means comprises a plurality of receptacles fixed to the circumference of each disk, with each receptacle being connected at its rear end to the end of each radial signal conductor, and being adapted to detachably accept at its front a selected lead pin of each of said CPU boards.

Each receptacle may have an L-shaped lead pin at its rear end, and tile L-shaped lead pin is inserted in and soldered to the conductive through hole with which a selected radial signal conductor is terminated.

Each receptacle further comprises an integrated parallel arrangement of receptacle s%ib-elements which are connected to a set of distinctive signal conductors extending radially at different levels in the thickness of the dielectric disk.

In use desired electrical connections between CPU boards and the system bus structure may be easily performed by arranging the CPU boards around the stack and by inserting the male lead pins of the CPU boards in the stationary receptacles of the disks of the stuck. Thus, the CPU boards are selectively connected to each other via the signal conductors of equal- length in all bus printed disks. The male lead pins of the CPU boards can be pulled out from the stationary receptacles of the disks of the stack very easily. In changing disks all male lead pins of the CPU boards are pulled out from the stationary receptacles of the disks of the stack, thereby disassembling the stack to permit selected disks to be changed.

BRIEF DESCRIPTION OF THE DRAWINGS

Other objects and advantages of the present invention may be understood from the following description of a preferred embodiment which is shown in the accompanying drawings wherein.

DETAILED DESCRIPTION OF PREFERRED EMBODIMENTS

Figure 1:
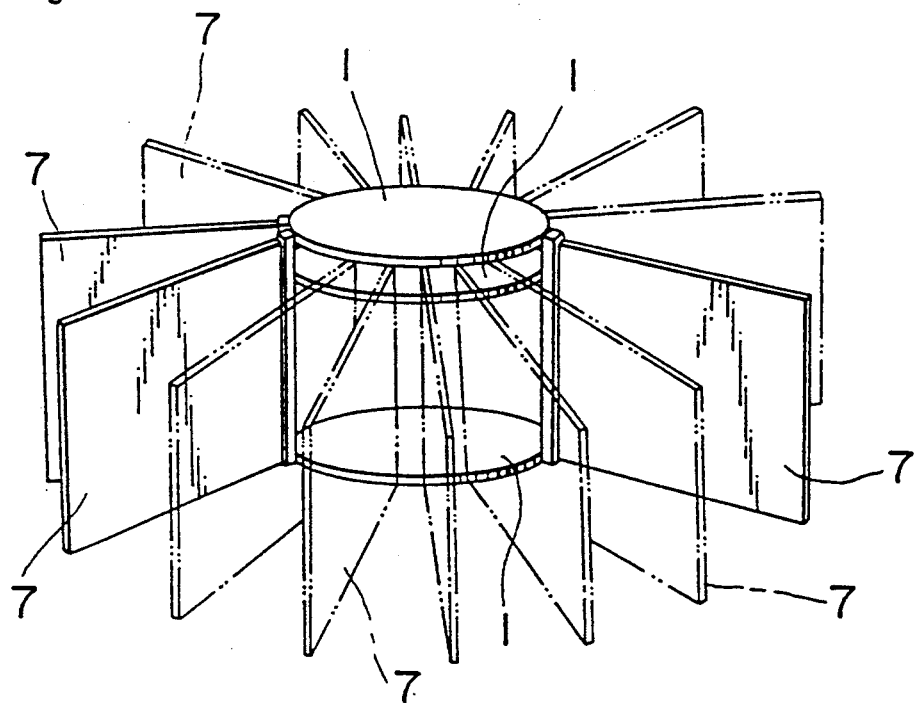
FIG. 1 is a perspective view of a radial-and-parallel system bus structure which is equipped with means for connecting CPU Boards to the system bus structure according to the present invention.
Figure 2:
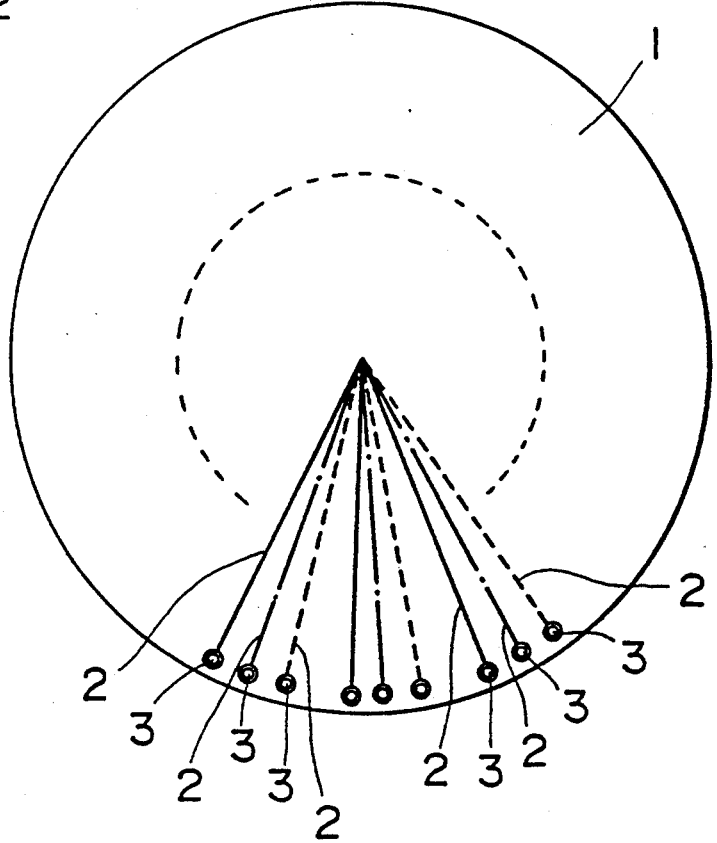
FIG. 2 is a plane view of one bus printed disk which consists of three layers at different levels of the thickness of the disk, each layer containing radial arrangement of signal conductors.

Referring to FIGS. 1 to 5, a radial-and-parallel system bus structure is comprised of a stack of bus-printed disks 1 whose centers are arranged on a common center axis. Each bus-printed disk 1 comprises a disk of dielectric material such as epoxy resin. It bears a printed radial pattern including a plurality of printed signal conductors 2 radially extending from the center of the disk. FIG. 2 shows a threelayer disk 1 which has sets of three distinctive signal conductors 2 ( solid, dot-and-dash, and broken lines ) extending radially at different levels in the thickness of dielectric disk 1.

Every signal conductor 2 is terminated in a through hole 3, which is made in the circumference of disk 1. The through hole may be plated or may have an electrically conductive piece fitted therein.

A plurality of receptacles 4 are fixed to the circumference of each disk. Each receptacle 4 is connected at its rear end to the end of each radial signal conductor, and is adapted to detachably accept at its front a selected lead pin of each of the CPU boards standing upright around the stack of bus-printed disks. Specifically, the lead pin 5 extending from the rear side of the receptacle 4 is bent at a right angle, and the bent portion 5a of the lead pin 5 is inserted in through hole 3 and soldered. Thus, every receptacle 4 is placed on the circumference of the disk with its opening front side facing outward.

Figure 3:
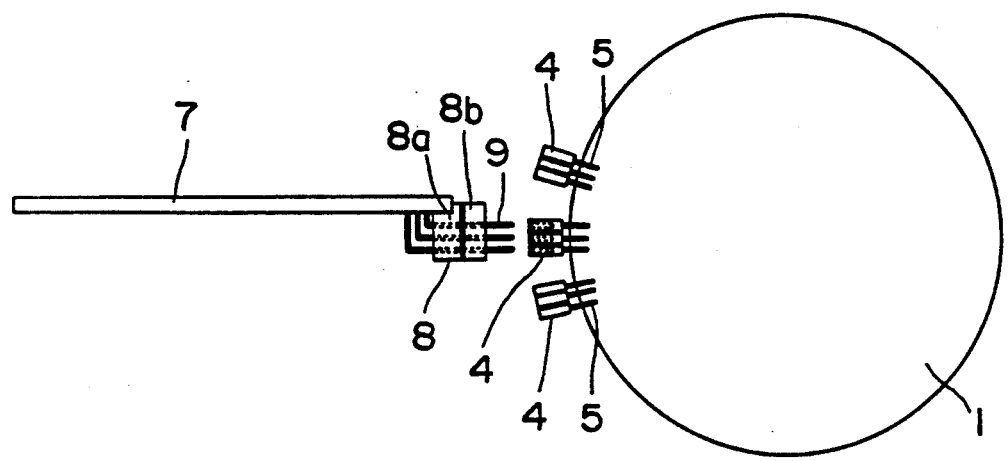
FIG. 3 is a plane view of one bus printed disk showing the manner in which a CPU board is connected to the disk.
Figure 5:
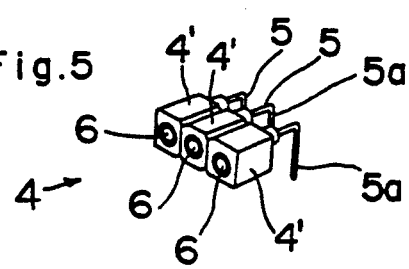
FIG. 5 is a perspective view of an integrated parallel arrangement of receptacle sub-elements.
Figure 6:
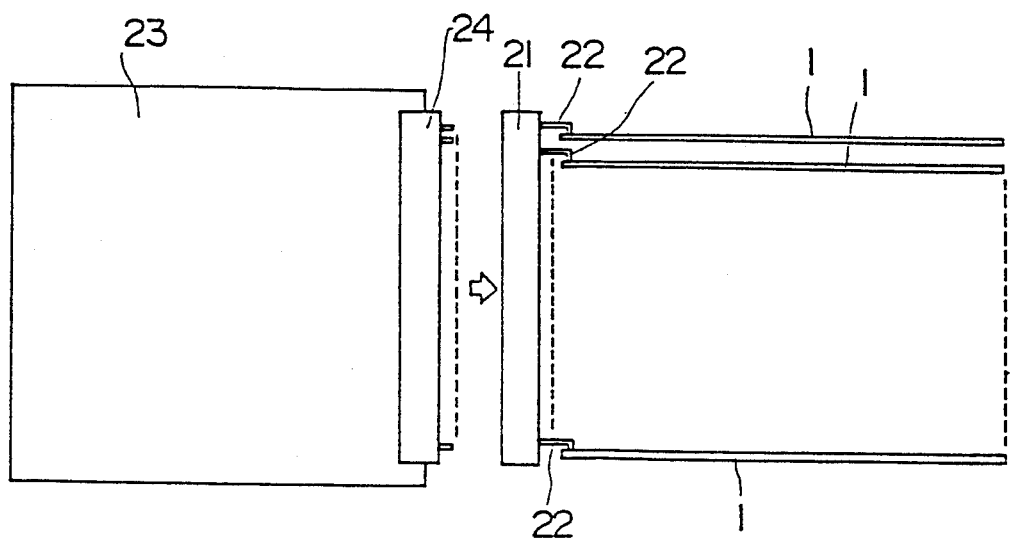
FIG. 6 is a side view of a conventional radial-and-parallel system bus structure and an associated CPU board.
Figure 7:
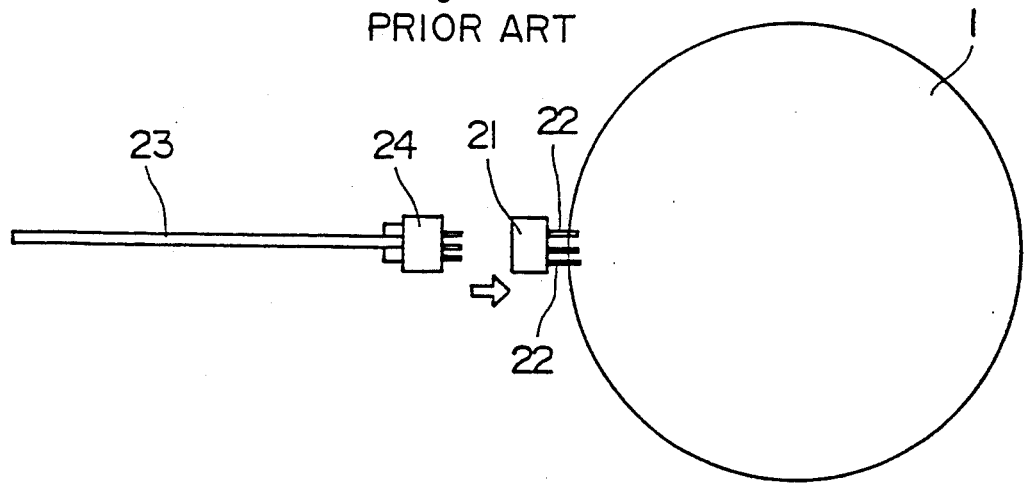
FIG. 7 is a plane view of the conventional radial-and-parallel system bus structure and an associated CPU board.

As seen from FIGS. 3 and 5, in case of a three-layer disk each receptacle comprises an integrated parallel arrangement of receptacle sub-elements 41. Bent portions 5a of rear conductors 5 of these receptacle sub-elements 41 are inserted in through holes 3 and soldered to distinctive signal conductors 2 ( solid, dot-and-dash, and broken lines ) extending radially at different levels in the thickness of dielectric disk 1.

A radial-and-parallel system bus structure may comprise of a stack of such bus-printed disks ( for instance, 12 disks ) whose centers are arranged on a common center axis, and a plurality of CPU boards 7 ( for instance, 20 boards ) are arranged radially around the stack to stand upright perpendicular to each and every disk 1.

Board connector 8 is attached to the longitudinal edge of each CPU board 7. Joint pins 9 of board connector 8 are inserted in holes 6 of stationary receptacle sub-elements 41 Connection between joint pins 9 and the sets of receptacle sub-elements 41 at a given angular position in all disks 1 is made at each different level ( FIG. 4 ) so that the corresponding set of receptacle sub-elements 41 of each CPU board may be connected to one and the same CPU board 7.

Figure 4:
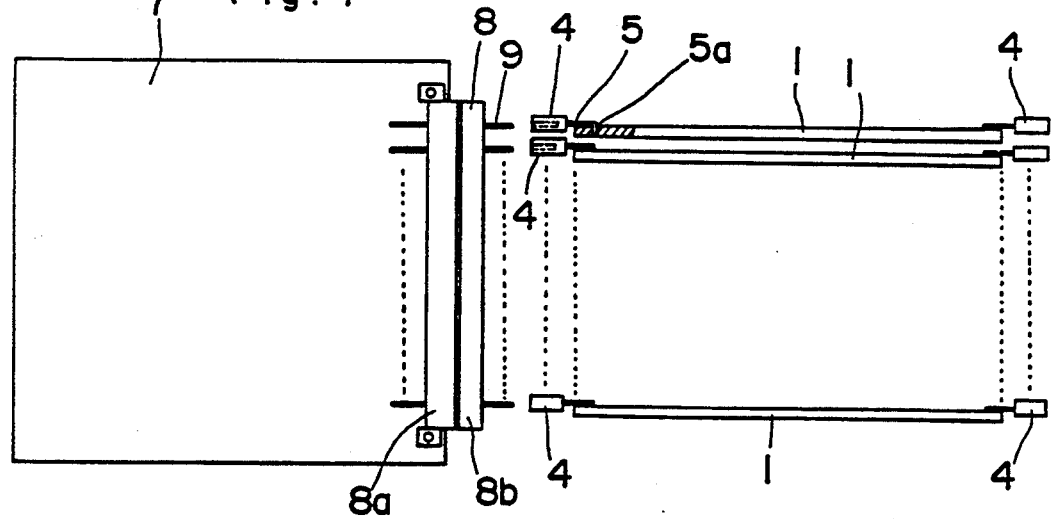
FIG. 4 is a side view of the stack and one CPU board.

As is best shown in FIGS. 3 and 4, board connector 8 is comprised of stationary plug ( or receptacle ) 8a and detachable receptacle ( or plug ) 8b. In connecting CPU boards 7 to the stack board assembly, first, detachable receptacles ( or plugs ) 8b of board connector 8 are mated with stationary receptacle sub-elements 41 arranged in longitudinal lines of the stack board assembly, and then, stationary plugs ( or receptacles 8a of CPU boards 7 are mated with detachable receptacles or plugs ) 8b already attached to the stack board assembly. This sequence of attachment permits the quick assembly of a radial-and-parallel system bus structure.

Each CPU board 7 is slidably held by upper and lower parallel guide rails (not shown). Bus printed disks 1 are supported by encircling 7 when board connectors 8 and stationary receptacles 4 are mated together, thus providing an integrated board pile assembly without the necessity of using extra holders.

In this particular embodiment bus-printed disk 1 is shown as having straight conductors of equal length radiating from its center. Conductors twisted in the form of a wave or sawtooth may be used in place of straight conductors.

The integrated board pile assembly can be easily disassembled simply by pulling CPU boards 7 away from all disks 1 , thereby disconnecting board connectors 8 from stationary receptacles 4 of disks 1.

What is claimed is:

1. Means for connecting a plurality of CPU boards to a radial-and-parallel system bus structure comprising:

a plurality of bus wire-printed boards in the form of disks mounted in spaced, mutually parallel relationship and having centers arranged on a common central axis, each of said bus wire-printed boards further comprising a disk of dielectric material having a radial pattern of printed circuit conductors including plural sets of printed circuit conductors extending radially from the center of the disk;

means fixed to the peripheral edge of each disk for connecting said printed circuit conductors of said disks to predetermined conductors of said CPU board standing upright around said bus wire-printed disks, said means further comprising plural sets of individual free standing receptacles arranged in mutually spaced relationship in linear stacks adjacent said peripheral edge of each of said disks, each of said free standing receptacles including a plurality of adjacent receptacle sub-elements arranged in a respective common plane transverse to said common central axis, each sub-element further having one respective end connected to an outer end of a printed circuit conductor of one set of said printed circuit conductors and the other end connectable to a predetermined conductor of said CPU boards; and each of said CPU boards further including an upright longitudinal edge facing the peripheral edges of said plurality of disks and having a respective pair of mutually detachable complementary linear connector elements extending lengthwise adjacent said longitudinal edge of each CPU board, one linear connector element of each said pair of linear connector elements further being complementary to said free standing receptacles arranged in said linear stacks of recpetacles fixed to the peripheral edge of said disks, said free standing receptacles including first type connector members, the other linear connector element of said pairs of detachable complementary linear connector elements including second type connector members, and wherein said one linear connector element of said pairs of linear connector elements include both types of connector members, whereby a rapid assembly of said radial-and-parallel system bus structure can be achieved by an attachment sequence of first mating said one linear connector elements of said pairs of linear connector elements to said free standing receptacles fixed to the edge of each said disk and then mating the other linear connector elements of said pairs of linear connector elements to said one linear connector elements.

2. Means for connecting a plurality of CPU boards to a radial-and-parallel system bus structure according to claim 1 wherein each said free standing receptacle comprises a receptacle having an L-shaped rear lead pin inserted in and bonded to a conductive through-hole terminating a selected printed circuit conductor.

3. Means for connecting a plurality of CPU boards to a radial-and-parallel system bus structure according to claim 1 wherein each said free standing receptacle comprises a receptacle including at least three integrated parallel receptacle subelements connected to respective printed circuit conductors of a said set of printed circuit conductors and wherein the conductors of each said set extend radially at different levels in the body of the dielectric disk.

4. Means for connecting a plurality of CPU boards to a radial-and-parallel system bus structure according to claim 1 wherein said other linear connector element of said pairs comprises a plug type connector, each free standing receptacle adjacent said peripheral edge of said disks comprises a receptacle type connector and wherein said one linear connector of said pairs is comprised of both plug type and receptacle type connector elements.

5. Means for connecting a plurality of CPU boards to a radial-and-parallel system bus structure according to claim 1 wherein each printed circuit conductor of a conductor set is at a different level in the body of the respective disk.

6. Means for connecting a plurality of CPU boards to a radial-and-parallel system bus structure according to claim 1 wherein said pair of mutually detachable complementary linear connector elements are offset from the respective longitudinal edge of each CPU board.

7. Means for connecting a plurality of CPU boards to a radial-and-parallel system bus structure according to claim 1 wherein said first type connector member comprises receptacle type members and wherein said second type connector members comprises plug type members.

* * * * *